US012568782B2

(12) United States Patent
Ohuchida et al.

(10) Patent No.: US 12,568,782 B2
(45) Date of Patent: Mar. 3, 2026

(54) ETCHING METHOD AND PLASMA PROCESSING SYSTEM

(71) Applicant: Tokyo Electron Limited, Tokyo (JP)

(72) Inventors: Satoshi Ohuchida, Miyagi (JP);
Masahito Yamaguchi, Miyagi (JP);
Maju Tomura, Miyagi (JP)

(73) Assignee: TOKYO ELECTRON LIMITED,
Tokyo (JP)

( * ) Notice: Subject to any disclaimer, the term of this
patent is extended or adjusted under 35
U.S.C. 154(b) by 300 days.

(21) Appl. No.: 18/127,668

(22) Filed: Mar. 29, 2023

(65) Prior Publication Data

US 2023/0317466 A1     Oct. 5, 2023

(30) Foreign Application Priority Data

Apr. 1, 2022     (JP) ................................. 2022-061885

(51) Int. Cl.
H01L 21/311          (2006.01)
H01J 37/32           (2006.01)
H01L 21/3065         (2006.01)
(52) U.S. Cl.
CPC .. H01L 21/31116 (2013.01); H01J 37/32128
(2013.01); H01J 37/32449 (2013.01); H01L
21/3065 (2013.01); *H01J 2237/3343* (2013.01)

(58) Field of Classification Search
None
See application file for complete search history.

(56)            References Cited

U.S. PATENT DOCUMENTS

| | | | |
|---|---|---|---|
| 2016/0343580 A1 | 11/2016 | Hudson | |
| 2016/0379856 A1* | 12/2016 | Tomura ............. | H01J 37/32165 |
| | | | 438/711 |
| 2018/0233356 A1* | 8/2018 | Han .................... | H01L 21/0217 |
| 2021/0143016 A1* | 5/2021 | Yokoyama ........ | H01J 37/32082 |
| 2021/0143028 A1* | 5/2021 | Yokoyama ........ | H01J 37/32715 |
| 2021/0343539 A1* | 11/2021 | Suda ................. | H01L 21/31116 |

FOREIGN PATENT DOCUMENTS

| | | |
|---|---|---|
| JP | 2020136669 A | 8/2020 |
| JP | 2022020007 A | 1/2022 |

* cited by examiner

*Primary Examiner* — Roberts P Culbert
(74) *Attorney, Agent, or Firm* — XSENSUS LLP

(57)            ABSTRACT

An etching method includes (a) providing a substrate having
a first silicon containing film and a second silicon containing
film including at least a silicon containing film of which type
is different from the first silicon containing film, on a
substrate support in a chamber, (b) supplying a processing
gas including a HF gas and a phosphorus containing gas into
the chamber, and (c) etching the first silicon containing film
and the second silicon containing film by generating plasma
from the processing gas in the chamber by a source RF
signal and generating a bias potential on the substrate by a
bias signal.

20 Claims, 6 Drawing Sheets

W

ETCHING METHOD AND PLASMA PROCESSING SYSTEM

CROSS-REFERENCE AND PRIORITY INFORMATION

The present application claims priority to Japanese Application No. 2022-061885, filed in Japan on Apr. 1, 2022, the content of which is incorporated by reference in its entirety.

TECHNICAL FIELD

Exemplary embodiments of the present disclosure relate to an etching method and a plasma processing system.

BACKGROUND ART

Patent Document 1 describes plasma etching of a silicon containing film using a processing gas that includes a fluorocarbon gas.

CITATION LIST

Patent Literature

PTL 1: US2016/0343580A

SUMMARY OF INVENTION

Technical Problem

An object of the present disclosure is to provide a technique for improving uniformity of an etching rate.

Solution to Problem

In one exemplary embodiment of the present disclosure, an etching method is provided, the etching method being executed in a plasma processing apparatus having a chamber, the method including (a) a step of providing a substrate having a first silicon containing film and a second silicon containing film including at least a silicon containing film of which type is different from the first silicon containing film, on a substrate support in a chamber, (b) a step of supplying a processing gas including a HF gas and a phosphorus containing gas into the chamber, and (c) a step of etching the first silicon containing film and the second silicon containing film by generating plasma from the processing gas in the chamber by a source RF signal and generating a bias potential on the substrate by a bias signal, in which in the step (c), (c1) a step of supplying the source RF signal and the bias signal and (c2) a step of stopping supply of at least one of the source RF signal and the bias signal or supplying at least one of the source RF signal and the bias signal, at an effective value of power lower than an effective value of power of the at least one of the source RF signal and the bias signal in the step (c1) are alternately repeated.

Advantageous Effect of the Invention

According to one exemplary embodiment of the present disclosure, a technique for improving uniformity of an etching rate can be provided.

DESCRIPTION OF EMBODIMENT

Figure 1:
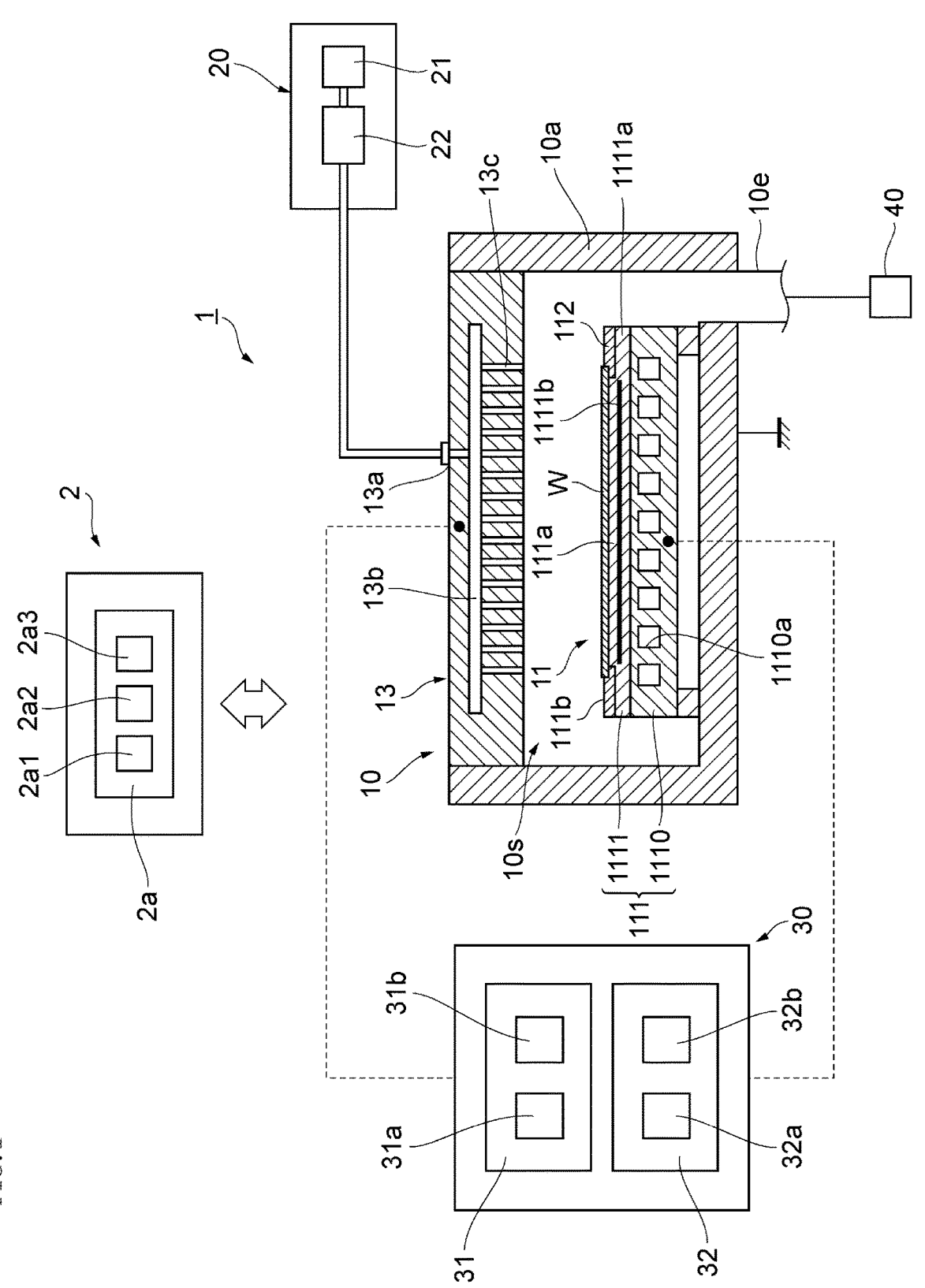
FIG. 1 is a diagram schematically illustrating an exemplary plasma processing system.

Hereinafter, embodiments of the present disclosure will be described.

In one exemplary embodiment, an etching method is provided, the etching method being executed in a plasma processing apparatus having a chamber, the method including (a) a step of providing a substrate having a first silicon containing film and a second silicon containing film including at least a silicon containing film of which type is different from the first silicon containing film, on a substrate support in a chamber, (b) a step of supplying a processing gas including a HF gas and a phosphorus containing gas into the chamber, and (c) a step of etching the first silicon containing film and the second silicon containing film by generating plasma from the processing gas in the chamber due to a source RF signal and generating a bias potential on the substrate due to a bias signal, in which in the step (c), (c1) a step of supplying the source RF signal and the bias signal and (c2) a step of stopping supply of at least one of the source RF signal and the bias signal or supplying at least one of the source RF signal and the bias signal, at an effective value of power lower than an effective value of power of the at least one of the source RF signal and the bias signal in the step (c1) are alternately repeated.

In one exemplary embodiment, in the step (c), the temperature of the substrate support is set to 0° C. or lower.

In one exemplary embodiment, the step (c) further includes a step of measuring the temperature of the substrate or the substrate support.

In one exemplary embodiment, in at least one of the step (c1) and the step (c2), any one or more of an effective value of power, a supply time, and a duty ratio in at least one of the source RF signal and the bias signal is adjusted based on the measured temperature.

In one exemplary embodiment, the first silicon containing film is a monolayer film made of one type of silicon containing film, and the second silicon containing film is a laminated film in which two or more types of silicon containing films are laminated.

In one exemplary embodiment, the first silicon containing film includes a silicon oxide film.

In one exemplary embodiment, the second silicon containing film includes a silicon oxide film and a silicon nitride film.

In one exemplary embodiment, the substrate has a carbon containing mask on the first silicon containing film and the second silicon containing film.

In one exemplary embodiment, in the step (c), a ratio of an etching rate of the second silicon containing film to an etching rate of the first silicon containing film is 0.95 to 1.05.

In one exemplary embodiment, the source RF signal and the bias signal are pulsed waves.

In one exemplary embodiment, the source RF signal and the bias signal are continuous waves.

In one exemplary embodiment, a flow rate of the HF gas is a largest among the processing gases supplied in the step (b), excluding an inert gas.

In one exemplary embodiment, the phosphorus containing gas is a halogenated phosphorus gas.

In one exemplary embodiment, the processing gas further includes at least any one of a fluorocarbon gas or a hydrofluorocarbon gas.

In one exemplary embodiment, the processing gas further includes a gas containing at least any one of tungsten, molybdenum, and titanium.

In one exemplary embodiment, the processing gas further includes an oxygen containing gas.

In one exemplary embodiment, the processing gas further includes a noble gas.

In one exemplary embodiment, an etching method is provided, the etching method being executed in a plasma processing apparatus having a chamber, the method including (a) a step of providing a substrate having a first silicon containing film and a second silicon containing film including at least a silicon containing film of which type is different from the first silicon containing film, on a substrate support in a chamber, (b) a step of supplying a processing gas into the chamber, and (c) a step of etching the first silicon containing film and the second silicon containing film by generating plasma including a HF species and a phosphorus chemical species from the processing gas in the chamber by a source RF signal and generating a bias potential on the substrate by a bias signal, in which in the step (c), (c1) a step of supplying the source RF signal and the bias signal, and (c2) a step of stopping supply of at least one of the source RF signal and the bias signal or supplying at least one of the source RF signal and the bias signal, at an effective value of power lower than an effective value of power of the at least one of the source RF signal and the bias signal in the step (c1) are alternately repeated.

In one exemplary embodiment, the HF species is generated from at least one gas of a HF gas or a hydrofluorocarbon gas.

In one exemplary embodiment, the HF species is generated from a hydrofluorocarbon gas having 2 or more carbon atoms.

In one exemplary embodiment, the HF species is generated from a fluorine containing gas and a hydrogen containing gas.

In one exemplary embodiment, a plasma processing system is provided, the plasma processing system including a chamber, a substrate support provided in the chamber, a power source, and a controller, in which the controller is configured to execute (a) control of providing a substrate having a first silicon containing film and a second silicon containing film including at least a silicon containing film of which type is different from the first silicon containing film, on the substrate support, (b) control of supplying a processing gas including a HF gas and a phosphorus containing gas into the chamber, (c) control of etching the first silicon containing film and the second silicon containing film by generating plasma from the processing gas in the chamber by a source RF signal, and generating a bias potential on the substrate by a bias signal, and in the control of the step (c), (c1) control of supplying the source RF signal and the bias signal from the power source and (c2) control of stopping supply of at least one of the source RF signal and the bias signal from the power source or supplying at least one of the source RF signal and the bias signal, at an effective value of power lower than an effective value of power of the at least one of the source RF signal and the bias signal in the step (c1) are alternately repeated.

Hereinafter, each embodiment of the present disclosure will be described in detail with reference to the drawings. In the drawings, the same or similar elements are denoted by the same reference numerals, and overlapping descriptions thereof will be omitted. Unless otherwise specified, a positional relationship of up/down, left/right, or the like will be described based on a positional relationship illustrated in the drawings. The dimensional ratios in the drawings do not indicate actual ratios, and the actual ratios are not limited to the illustrated ratios.

[Configuration Example of Plasma Processing System]

Hereinafter, a configuration example of a plasma processing system will be described. FIG. 1 is a view for explaining an example of a configuration of a capacitively-coupled plasma processing apparatus.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space 10s. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of the substrate W. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. Accordingly, the central region 111a is also referred to as a substrate support surface for supporting the substrate W, and the annular region 111b is also referred to as a ring support surface for supporting the ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111*b*. Other members that surround the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described later may be disposed in the ceramic member 1111*a*. In this case, at least one RF/DC electrode functions as the lower electrode. In a case where a bias RF signal and/or a DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as brine or a gas, flows through the flow path 1110*a*. In one embodiment, the flow path 1110*a* is formed inside the base 1110, and one or more heaters are disposed in the ceramic member 1111*a* of the electrostatic chuck 1111. Further, the substrate support 11 may include a heat transfer gas supply configured to supply a heat transfer gas to a gap between a rear surface of the substrate W and the central region 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. In addition to the shower head 13, the gas introduction unit may include one or more side gas injectors (SGI) that are attached to one or more openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power) to at least one lower electrode and/or at least one upper electrode. Accordingly, plasma is formed from at least one processing gas supplied into the plasma processing space 10*s*. Accordingly, the RF power source 31 may function as at least a part of a plasma generator configured to generate plasma from one or more processing gases in the plasma processing chamber 10. Further, supplying the bias RF signal to at least one lower electrode can generate a bias potential in the substrate W to attract an ionic component in the formed plasma to the substrate W.

In one embodiment, the RF power source 31 includes a first RF generator 31*a* and a second RF generator 31*b*. The first RF generator 31*a* is configured to be coupled to at least one lower electrode and/or at least one upper electrode via at least one impedance matching circuit to generate a source RF signal (source RF power) for plasma generation. In one embodiment, the source RF signal has a frequency in a range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in a range of 100 kHz to 60 MHz. In one embodiment, the second RF generator 31*b* may be configured to generate a plurality of bias RF signals having different frequencies. The generated one or more bias RF signals are supplied to at least one lower electrode. In addition, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to at least one lower electrode to generate the first DC signal. The generated first bias DC signal is applied to at least one lower electrode. In one embodiment, the second DC generator 32*b* is configured to be connected to at least one upper electrode to generate a second DC signal. The generated second DC signal is applied to at least one upper electrode.

In various embodiments, at least one of the first and second DC signals may be pulsed. In this case, a sequence of voltage pulses based on DC signals is applied to at least one lower electrode and/or at least one upper electrode. The voltage pulse may have a pulse waveform of a rectangle, a trapezoid, a triangle, or a combination thereof. In one embodiment, a waveform generator for generating a sequence of voltage pulses from the DC signal is connected between the first DC generator 32*a* and at least one lower electrode. Accordingly, a voltage pulse generator is configured with the first DC generator 32*a* and the waveform generator. In a case where the voltage pulse generator is configured with the second DC generator 32*b* and the waveform generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor 2a1, a storage unit 2a2, and a communication interface 2a3. The controller 2 is implemented by, for example, a computer 2a. The processor 2a1 may be configured to read a program from the storage unit 2a2 and perform various control operations by executing the read program. The program may be stored in advance in the storage unit 2a2, or may be acquired via a medium when necessary. The acquired program is stored in the storage unit 2a2, and is read from the storage unit 2a2 and executed by the processor 2a1. The medium may be various storing media readable by the computer 2a, or may be a communication line connected to the communication interface 2a3. The processor 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

<Examples of Etching Methods>

Figure 2:
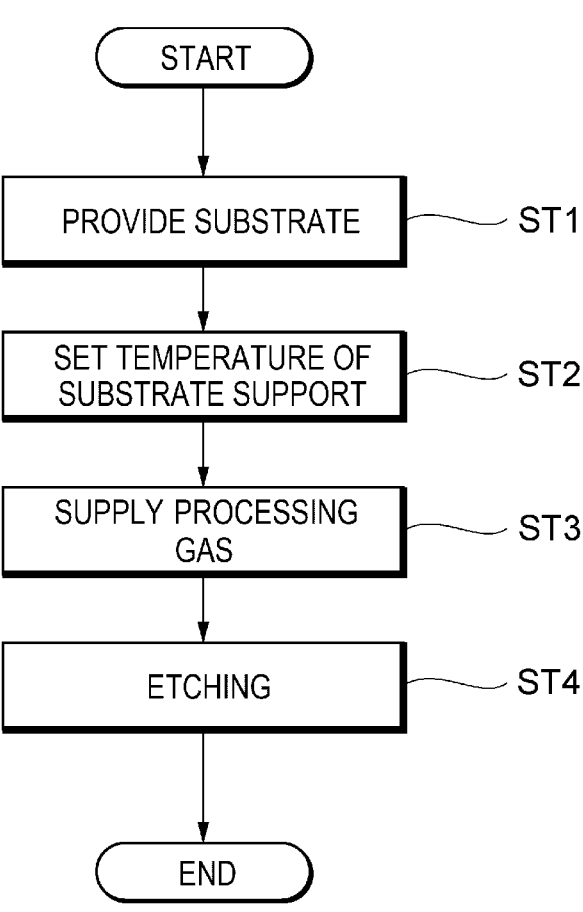
FIG. 2 is a flowchart illustrating an example of the present processing method.

FIG. 2 is a flowchart illustrating an etching method (hereinafter, also referred to as a "present processing method") according to one exemplary embodiment. As illustrated in FIG. 2, the present processing method includes step ST1 of providing a substrate, step ST2 of setting the temperature of a substrate support, step ST3 of supplying a processing gas, and step ST4 of performing etching. Processing in each step may be executed by the plasma processing system illustrated in FIG. 1. Hereinafter, a case where the controller 2 controls each part of the plasma processing apparatus 1 to execute the present processing method for the substrate W will be described by way of an example.

(Step ST1: Provision of Substrate)

Figure 3:
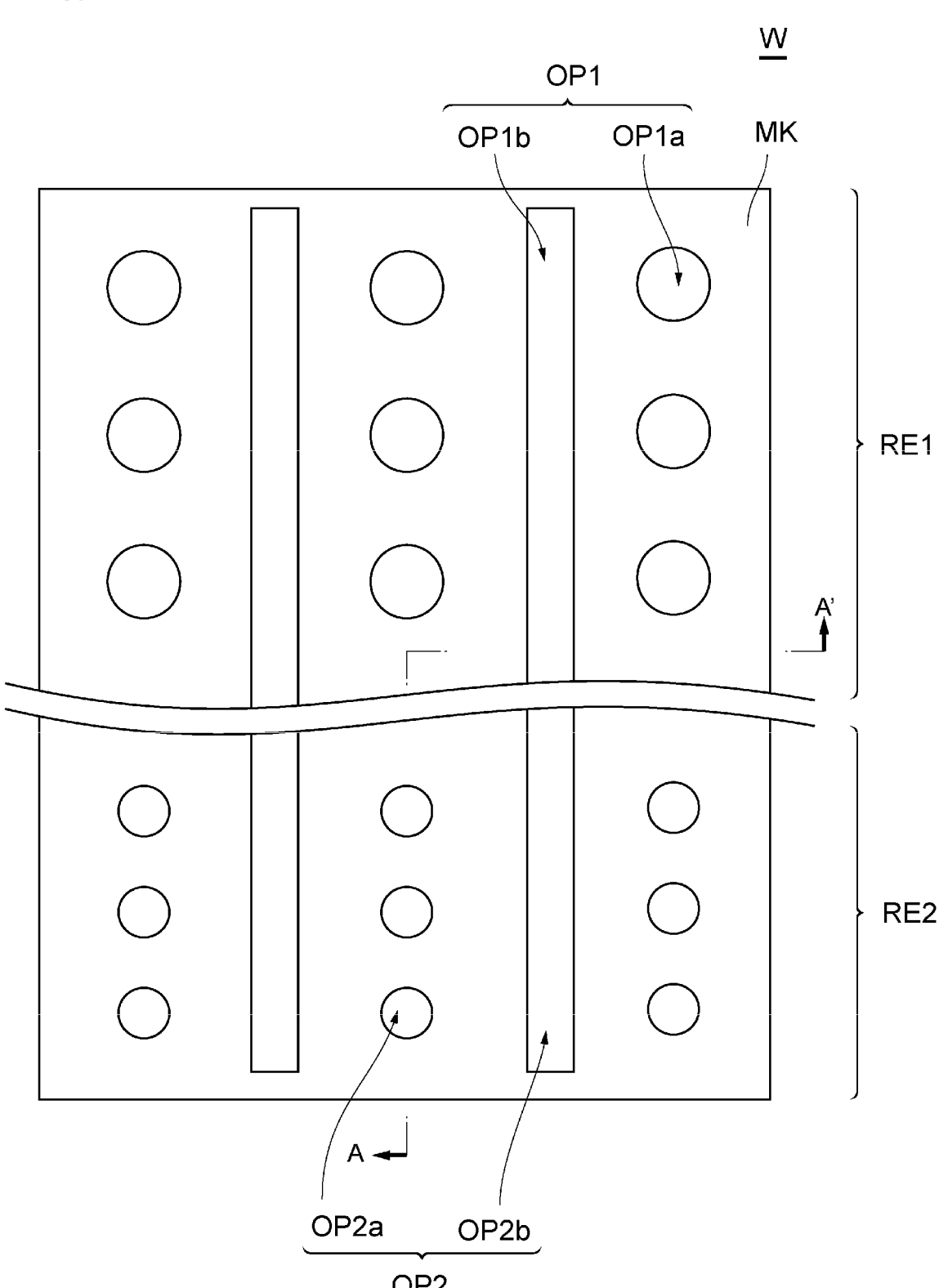
FIG. 3 is a top view illustrating an example of a substrate W prepared in step ST1.
Figure 4:
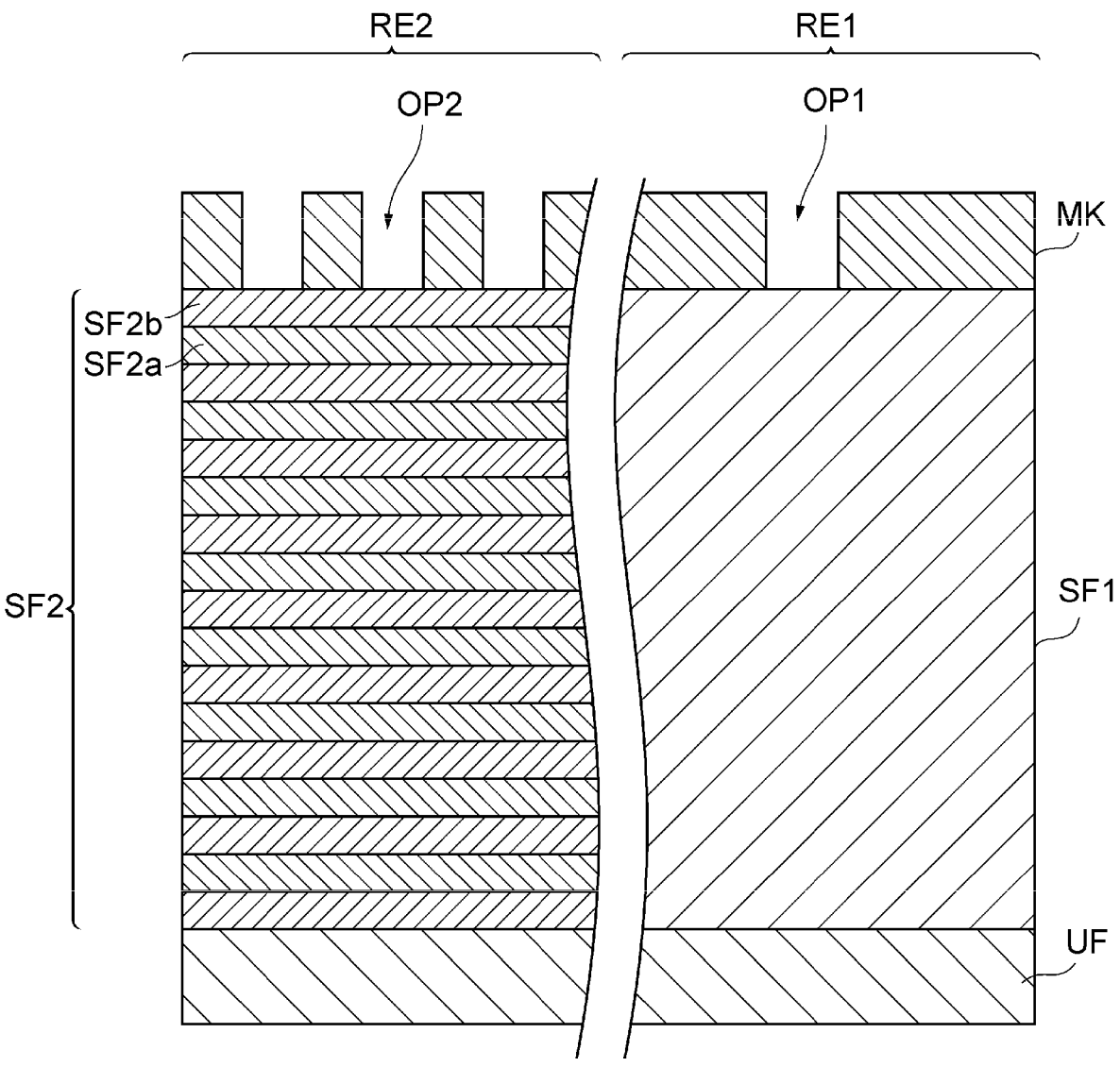
FIG. 4 is a view illustrating a part of an AA' cross-section of the substrate W illustrated in FIG. 3.

In step ST1, the substrate W is provided in the plasma processing space 10s of the plasma processing apparatus 1. The substrate W is disposed on the upper surface of the substrate support 11 to face the upper electrode, and is held by the substrate support 11 by the electrostatic chuck 1111. FIG. 3 is a top view illustrating an example of the substrate W provided in step ST1. FIG. 4 is a view illustrating a part of an AA' cross-section of the substrate W illustrated in FIG. 3. The substrate W may be used for manufacturing a semiconductor device that includes a semiconductor memory device such as a DRAM or a 3D-NAND flash memory.

The substrate W has a first region RE1 and a second region RE2. In a plan view (a top view of FIG. 3) of the substrate W, the first region RE1 and the second region RE2 are regions each having a predetermined range on the substrate W. The first region RE1 and the second region RE2 may be two regions adjacent to each other, or may be two regions apart from each other. The first region RE1 may be, for example, a contact region or a peripheral circuit region in the semiconductor memory device. In an example, the contact region is a region where one or more contact holes for electrically connecting one or more memory cells and a peripheral circuit are provided. Further, the second region RE2 may be, for example, a memory cell region in the semiconductor memory device.

The substrate W has an underlying film UF provided across the first region RE1 and the second region RE2. The underlying film UF may be, for example, a silicon wafer, or an organic film, a dielectric film, a metal film, a semiconductor film, or the like formed on the silicon wafer. The underlying film UF may be a monolayer film or a laminated film in which a plurality of films are laminated. In an example, the underlying film UF is a polysilicon film.

The substrate W has a first silicon containing film SF1 provided on the underlying film UF in the first region RE1. In an example, the first silicon containing film SF1 may contain at least one of a silicon oxide film, a silicon nitride film, a silicon oxynitride film, or a polysilicon film. The first silicon containing film SF1 may be a monolayer film, or may be a laminated film in which two or more types of silicon containing films are laminated. In an example, the first silicon containing film SF1 is a monolayer film of a silicon oxide film.

The substrate W has a second silicon containing film SF2 provided on the underlying film UF in the second region RE2. The second silicon containing film SF2 includes at least a silicon containing film of a film type different from the first silicon containing film SF1. The first silicon containing film SF1 and the second silicon containing film SF2 may have the same thickness or different thicknesses. In an example, the second silicon containing film SF2 may contain at least one of a silicon oxide film, a silicon nitride film, a silicon oxynitride film, or a polysilicon film. The second silicon containing film SF2 may be a monolayer film, or may be a laminated film in which two or more types of silicon containing films are laminated. In an example, the second silicon containing film SF2 is a laminated film in which silicon nitride films SF2a and silicon oxide films SF2b are alternately and repeatedly laminated.

The substrate W further has a mask MK. The mask MK is provided on the first silicon containing film SF1 and the second silicon containing film SF2. That is, the mask MK is provided across the first region RE1 and the second region RE2. The mask MK has a predetermined pattern. The mask MK is provided with one or more openings OP1 in the first region RE1 (circular openings provided in the first region RE1 are also referred to as openings OP1a and rectangular slits (openings) are also referred to as openings OP1b). In an example, each of the one or more openings OP1 is an opening defined by a sidewall formed in the mask MK. Further, the mask MK is provided with one or more openings OP2 in the second region RE2 (circular openings provided in the second region RE2 are also referred to as openings OP2a and rectangular slits (openings) are also referred to as openings OP2b). In an example, the one or more openings OP2 are openings defined by the sidewall formed in the mask MK.

In an example, the opening OP1 and the opening OP2 are openings for forming holes in which memory cells are formed, contact holes, line-and-spaces, slits, trenches, and the like in the first silicon containing film SF1 and/or the second silicon containing film SF2. In an example, the opening OP1 and the opening OP2 have shapes such as circular, elliptical, linear, and rectangular shapes in a plan view. The opening OP1 and the opening OP2 may have the same shape or may have different shapes in a plan view. The opening OP1 may have the same width as the opening OP2 (for example, the diameter of a circular opening, the short diameter of an elliptical opening, the line width of a linear opening, and the length of a short side or a long side of a rectangular opening) or a different width from the opening OP2. Further, the opening OP1 and the opening OP2 may be integrally formed openings. As an example, the opening OP1 and the opening OP2 may be a part of one slit formed across the first region RE1 and the second region RE2.

In an example, as illustrated in FIG. 3, the first region RE1 of the mask MK may be provided with a plurality of openings OP1$a$ having a circular shape in a plan view. Further, the second region RE2 of the mask MK may be provided with a plurality of openings OP2$a$ having a circular shape in a plan view. The width (diameter) of the opening OP1$a$ provided in the first region RE1 may be wider or narrower than the width (diameter) of the opening OP2$a$ provided in the second region RE2, or may be the same as the width (diameter) of the opening OP2$a$.

In an example, as illustrated in FIG. 3, an opening having a slit shape in a plan view may be provided across the first region RE1 and the second region RE2 of the mask MK. The opening has an opening OP1$b$, which is a portion provided in the first region RE1 of the mask MK, and an opening OP2$b$, which is a portion provided in the second region RE2. The widths of the opening OP1$b$ and the opening OP2$b$ may be wider or narrower than the widths (diameters) of the opening OP1$a$ and/or the opening OP2$a$, and may be the same as the widths (diameters) of the opening OP1$a$ and/or the opening OP2$a$. Further, the width of the opening OP1$b$ may be wider or narrower than the width of the opening OP2$b$, and may be the same as the width of the opening OP2$b$. Further, the opening having the slit shape in FIG. 3 may be provided only in either the first region RE1 or the second region RE2. That is, the opening may be a slit having only one of the opening OP1$b$ and the opening OP2$b$.

The mask MK is formed of a material having an etching rate lower than the etching rates of the first silicon containing film SF1 and the second silicon containing film SF2 in step ST4. The mask MK may be formed of a carbon containing material. The mask MK may be, for example, an amorphous carbon film, a photoresist film, or a spin-on carbon film (SOC film). The mask MK may be, for example, a metal containing film including a metal such as tungsten.

At least some part of the process of forming each configuration of the substrate W may be performed in the plasma processing chamber 10. In an example, a step of etching the mask MK to form the openings OP1 and OP2 may be executed in the plasma processing chamber 10. That is, the etching of the openings OP1 and OP2, and the first silicon containing film SF1 and the second silicon containing film SF2 to be described later may be consecutively executed in the same chamber. Further, after all or some part of each configuration of the substrate W is formed by an apparatus or a chamber outside the plasma processing apparatus 1, the substrate W may be loaded into the plasma processing space 10$s$ of the plasma processing apparatus 1 and disposed on the upper surface of the substrate support 11.

(Step ST2: Temperature Setting of Substrate Support)

In step ST2, the temperature control module adjusts the temperature of the substrate support 11 to a set temperature of 0° C. or lower. The set temperature may be −10° C. or lower, −20° C. or lower, −30° C. or lower, −40° C. or lower, −50° C. or lower, −60° C. or lower, or −70° C. or lower. In an example, adjusting or maintaining the temperature of the substrate support 11 includes adjusting or maintaining the temperature of the heat transfer fluid flowing through the flow path 1110$a$ to the set temperature or a temperature different from the set temperature. In an example, adjusting or maintaining the temperature of the substrate support 11 includes controlling the pressure of a heat transfer gas (for example, He) between the electrostatic chuck 1111 and the rear surface of the substrate W. The time at which the heat transfer fluid starts to flow through the flow path 1110$a$ may be before or after the substrate W is placed on the substrate support 11, or may be at the same time. In the present processing method, step ST2 may be performed before step ST1. That is, after the temperature of the substrate support 11 is adjusted to the set temperature, the substrate W may be provided to the substrate support 11. In the present processing method, the temperature of the substrate support 11 is maintained at the set temperature in step ST3 and step ST4 as well.

(Step ST3: Supply of Processing Gas)

In step ST3, a processing gas is supplied from the gas supply 20 into the plasma processing space 10$s$. The processing gas includes a HF gas (hydrogen fluoride gas) and a phosphorus containing gas. During step ST3, the temperature of the substrate support 11 is maintained at the set temperature (for example, −70° C.).

A flow rate of the HF gas may be the largest among the processing gases, excluding an inert gas. In an example, the HF gas may be 50% by volume or more, 60% by volume or more, 70% by volume or more, or 80% by volume or more with respect to the total flow rate of the processing gas excluding the inert gas. As the HF gas, a gas with high purity, for example, a gas with 99.999% or more purity can be used.

The processing gas may contain a gas capable of generating an HF species in the plasma, instead of or in addition to the HF gas. Here, the HF species contains at least any one of a gas, a radical, and an ion of hydrogen fluoride.

In an example, a hydrofluorocarbon gas may be used as the gas capable of generating the HF species. The hydrofluorocarbon gas may have 2 or more, 3 or more, or 4 or more carbon atoms. In an example, the hydrofluorocarbon gas may be at least one selected from the group consisting of a $CH_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas and a $C_5H_3F_7$ gas. In an example, the hydrofluorocarbon gas may be at least one selected from the group consisting of a $CH_2F_2$ gas, a $C_3H_2F_4$ gas, a $C_3H_2F_6$ gas and a $C_4H_2F_6$ gas.

In an example, a fluorine containing gas and a hydrogen containing gas may be used as the gas capable of generating the HF species. In an example, a fluorocarbon gas may be used as the fluorine containing gas. The fluorocarbon gas may contain at least one selected from the group consisting of a $C_2F_2$ gas, a $C_2F_4$ gas, a $C_3F_6$ gas, a $C_3F_8$ gas, a $C_4F_6$ gas, a $C_4F_8$ gas and a $C_5F_8$ gas. In an example, an $NF_3$ gas or an $SF_6$ gas may be used as the fluorine containing gas. In an example, an $H_2$ gas, a $CH_4$ gas, or a $NH_3$ gas may be used as the hydrogen containing gas.

The phosphorus containing gas is a gas containing a phosphorus containing molecule. The phosphorus containing molecule may be an oxide, such as tetraphosphorus decaoxide ($P_4O_{10}$), tetraphosphorus octoxide ($P_4O_8$), and tetraphosphorus hexaoxide ($P_4O_6$). The tetraphosphorus decaoxide is sometimes called diphosphorus pentoxide ($P_2O_5$). The phosphorus containing molecules may be a halide (phosphorus halide), such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the phosphorus containing molecule may contain fluorine as a halogen element, such as phosphorus fluoride. Alternatively, the phosphorus containing molecule may contain a halogen element other than fluorine, as the halogen element. The phosphorus containing molecule may be halogenated phosphoryl, such as phosphoryl fluoride ($POF_3$), phosphoryl chloride ($POCl_3$), and phosphoryl bromide ($POBr_3$). The phosphorus containing molecule may be phosphine ($PH_3$), calcium phosphide (such as $Ca_3P_2$), phosphoric acid ($H_3PO_4$), sodium phosphate ($Na_3PO_4$), hexafluorophosphoric acid ($HPF_6$) or the like. The phosphorus containing molecule may be fluorophosphines ($H_gPF_h$). Here, the sum of g and h is 3 or 5. As the fluorophosphine, $HPF_2$ and $H_2PF_3$ are exemplified. The processing gas may contain one or more phosphorus containing molecules among the phosphorus containing molecules described above, as at least one phosphorus containing molecule. For example, the processing gas may contain at least one of $PF_3$, $PCl_3$, $PF_5$, $PCl_5$, $POCl_3$, $PH_3$, $PBr_3$, or $PBr_5$ as at least one phosphorus containing molecule. In a case where each phosphorus containing molecule contained in the processing gas is a liquid or a solid, each phosphorus containing molecule may be evaporated by heating or the like and supplied into the plasma processing space $10s$.

The processing gas may further contain a carbon containing gas. The carbon containing gas may be at least one or both of a fluorocarbon gas or a hydrofluorocarbon gas. The fluorocarbon gas may contain at least one selected from the group consisting of a $C_2F_2$ gas, a $C_2F_4$ gas, a $C_3F_6$ gas, a $C_3F_8$ gas, a $C_4F_6$ gas, a $C_4F_8$ gas and a $C_5F_8$ gas. The hydrofluorocarbon gas may contain at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas and a $C_5H_3F_7$ gas. Further, the carbon containing gas may be a linear one having an unsaturated bond. The gas containing linear carbon having an unsaturated bond may be, for example, at least one selected from the group consisting of a $C_3F_6$ (hexafluoropropene) gas, a $C_4F_8$ (octafluoro-1-butene, octafluoro-2-butene) gas, a $C_3H_2F_4$ (1,3,3,3-tetrafluoropropene) gas, a $C_4H_2F_6$ (trans-1,1,1,4,4,4-hexafluoro-2-butene) gas, a C4F8O (pentafluoroethyl trifluorovinyl ether) gas, a $CHF_3COF$ (1,2,2,2-tetrafluoroethane-1-one) gas, a $CHF_2COF$ (difluoroacetic acid fluoride) gas, and a $COF_2$ (fluorinated carbonyl) gas.

The processing gas may further contain a tungsten containing gas. The tungsten containing gas may be a gas containing tungsten and halogen, and in one example, is a $WF_aCl_b$ gas (a and b are each an integer of 0 or more and 6 or less, and a sum of a and b is 2 or more and 6 or less). Specifically, the tungsten containing gas may be a gas containing tungsten and fluorine, such as a tungsten difluoride ($WF_2$) gas, a tungsten tetrafluoride ($WF_4$) gas, a tungsten pentafluoride ($WF_5$) gas, or a tungsten hexafluoride ($WF_6$) gas, or a gas containing tungsten and chlorine, such as a tungsten dichloride ($WCl_2$) gas, a tungsten tetrachloride ($WCl_4$) gas, a tungsten pentachloride ($WCl_5$) gas, or a tungsten hexachloride ($WCl_6$) gas. Among these, at least any gas of a $WF_6$ gas and a $WCl_6$ gas may be used. The flow rate of the tungsten containing gas may be 5% by volume or less, 1% by volume or less, 0.5% by volume or less, or 0.2% by volume or less with respect to the total flow rate of the processing gas excluding the inert gas.

The processing gas may contain at least one of a molybdenum containing gas and a titanium containing gas, instead of or in addition to the tungsten containing gas.

The processing gas may further contain an oxygen containing gas. The oxygen containing gas may be, for example, at least one gas selected from the group consisting of $O_2$, CO, $CO_2$, $H_2O$, and $H_2O_2$. In an example, the processing gas may be an oxygen containing gas other than $H_2O$, that is, may contain at least one gas selected from the group consisting of $O_2$, CO, $CO_2$ and $H_2O_2$. The flow rate of the oxygen containing gas may be adjusted according to the flow rate of the carbon containing gas such as a fluorocarbon gas or a hydrofluorocarbon gas.

The processing gas may further contain a noble gas such as an Ar gas, a He gas, or a Kr gas, or an inert gas such as a nitrogen gas.

(Step ST4: Etching)

Figure 5:
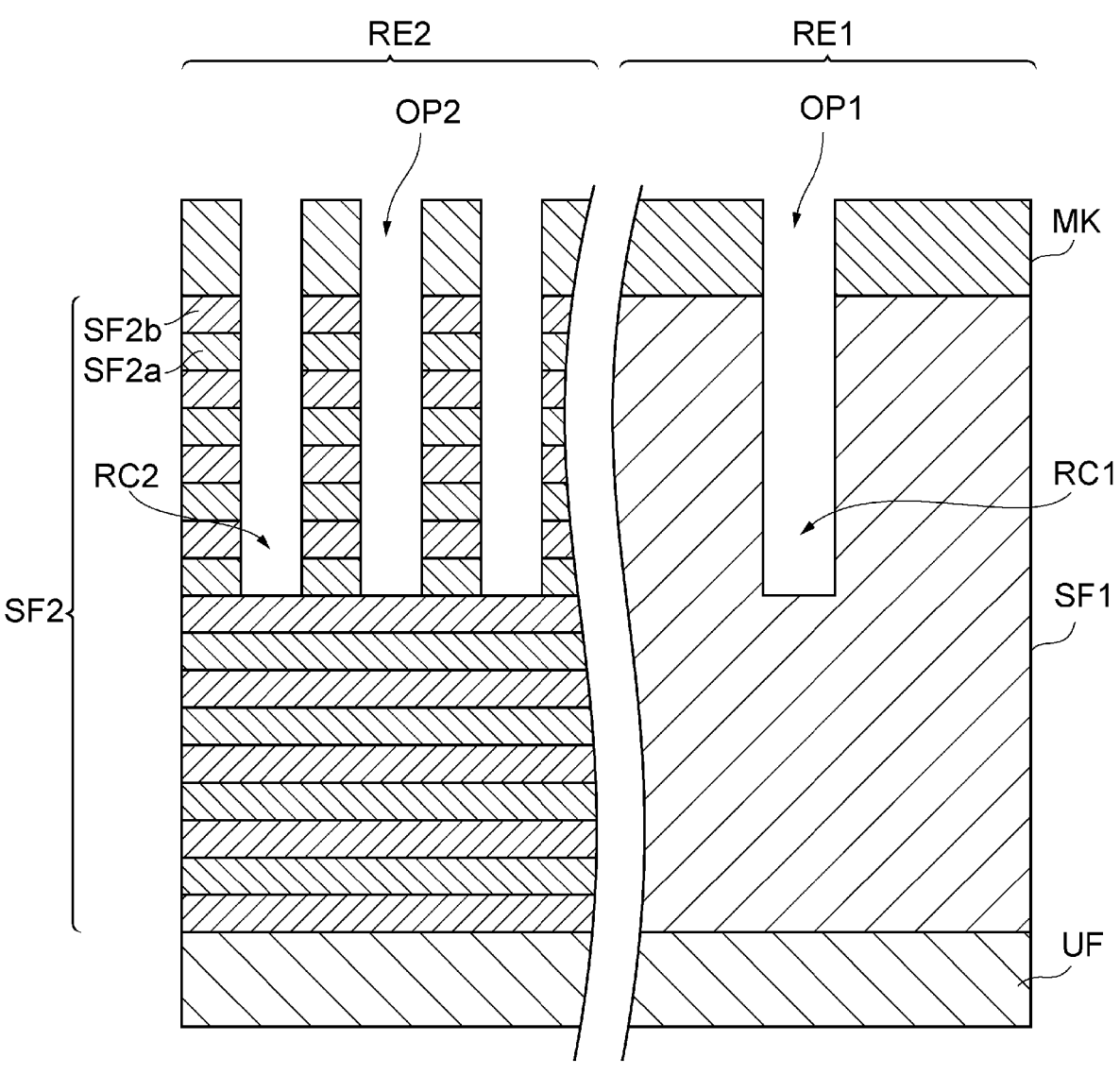
FIG. 5 is a view illustrating a cross-sectional structure of the substrate W during processing in step ST4.

FIG. 5 is a view illustrating an example of a cross-sectional structure of the substrate W during processing in step ST4. In step ST4, the first silicon containing film SF1 and the second silicon containing film SF2 are etched simultaneously. During step ST4, the temperature of the substrate support 11 is maintained at the set temperature (for example, −70° C.).

In step ST4, supplying at least one of the source RF signal and the bias signal and stopping the supply may be alternately repeated. For example, supplying the bias signal and stopping the supply may be alternately repeated while the source RF signal is consecutively supplied. Further, for example, the bias signal may be consecutively supplied while supplying the source RF signal and stopping the supply are alternately repeated. Further, for example, supplying both the source RF signal and the bias signal and stopping the supply may be alternately repeated. Here, the source RF signal is a signal for generating plasma from the processing gas, and is supplied from the first RF generator 31*a* to the lower electrode and/or the upper electrode. In an example, the source RF signal has a frequency in a range of 10 MHz to 150 MHz.

Further, the bias signal is a signal for generating a bias potential in the substrate W, and is supplied to the lower electrode from the second RF generator 31*b* as the bias RF signal or from the DC generator 32*a* as the bias DC signal. In an example, the bias signal has a frequency in a range of 1 kHz to 200 kHz. The bias signal may have a frequency in a range of 5 kHz to 100 kHz.

In the source RF signal and the bias signal, both may be continuous waves or pulsed waves, or one may be continuous waves and the other may be pulsed waves. When both the source RF signal and the bias signal are pulsed waves, the cycles of both the pulsed waves may be synchronized. Further, the duty ratio of the pulsed waves may be appropriately set, and may be, for example, 1% to 80%, or 5% to 50%. The duty ratio is a ratio of a period in which the power or the voltage level is high with respect to the cycle of the pulsed waves. Further, in a case of using the bias DC signal, the pulsed wave may have a waveform of a rectangle, a trapezoid, a triangle, or a combination thereof. The polarity of the bias DC signal may be negative or positive as long as the potential of the substrate W is set such that a potential difference is given between the plasma and the substrate to draw in ions.

As described above, in step ST4, supplying at least one of the source RF signal and the bias signal and stopping the supply may be repeated a plurality of times. Since heat input is performed by these signals while the source RF signal and/or the bias signal are supplied, the surface temperature of the substrate W becomes higher than the set temperature (for example, −70° C.) of the substrate support 11. Since there is no heat input by these signals while the supply of the source RF signal and/or the bias signal is stopped, the surface temperature of the substrate W approaches the set temperature (for example, −70° C.) of the substrate support 11. That is, the surface temperature of the substrate W is controlled by repeating supplying at least one of the source RF signal and the bias signal and stopping the supply. The surface temperature of the substrate W is maintained at a lower temperature compared to the case of the consecutive supply of the source RF signal and the bias signal.

In step ST4, the supply and the stop of the source RF signal and/or the bias signal may be periodically repeated. That is, a period T1 for supplying the source RF signal and/or the bias signal and a period T2 for stopping the supply of the source RF signal and the bias signal are defined as one cycle, and the cycle may be repeated a plurality of times. In an example, each of the period T1 and the period T2 may be a period in a range of 0.1 second to 30 seconds, may be a period in a range of 0.5 second to 20 seconds, or may be a period in a range of 1 second to 10 seconds. The ratio (ON/OFF ratio) between the period T1 and the period T2 may be appropriately set based on the target surface temperature of the substrate W. When the period T2 becomes longer than the period T1, the surface temperature of the substrate W becomes lower, and when the period T2 becomes shorter than the period T1, the surface temperature of the substrate W becomes higher.

By the supply of the source RF signal and the bias RF signal, plasma is generated from the processing gas, a bias potential is generated in the substrate W, and a chemical species in the plasma are drew to the surface of the substrate W. As a result, as illustrated in FIG. 5, a portion of the first silicon containing film SF1 exposed in the opening OP1 is etched in a depth direction (direction from the upper side to the lower side in FIG. 5). A recess RC1 is formed in the first silicon containing film SF1 based on the shape of the opening OP1 of the mask MK. Further, a portion of the second silicon containing film SF2 exposed in the opening OP2 is etched in the depth direction. Then, a recess RC2 is formed in the second silicon containing film SF2 based on the shape of the opening OP2 of the mask MK. That is, the etching of the first silicon containing film SF1 and the second silicon containing film SF2 progresses simultaneously.

In step ST4, supplying the source RF signal and/or the bias signal and stopping the supply may be repeated to perform the etching. As a result, the surface temperature of the substrate W may be decreased, and the adsorption of the HF species in the recess RC1 and the recess RC2 may be promoted, compared to the case where the source RF signal and the bias signal are consecutively supplied. Therefore, the etching rates of the first silicon containing film SF1 and the second silicon containing film SF2 become high. Further, the increase amount of the etching rate due to the decrease in the surface temperature of the substrate W is different between the first silicon containing film SF1 and the second silicon containing film SF2. Therefore, by adjusting the decrease amount in the surface temperature of the substrate W, it is possible to reduce the difference in the etching rate between the first silicon containing film SF1 and the second silicon containing film SF2. That is, the selection ratio of the second silicon containing film to the first silicon containing film may approach 1. For example, the selection ratio may be suppressed to a range of 0.95 to 1.05.

Figure 6:
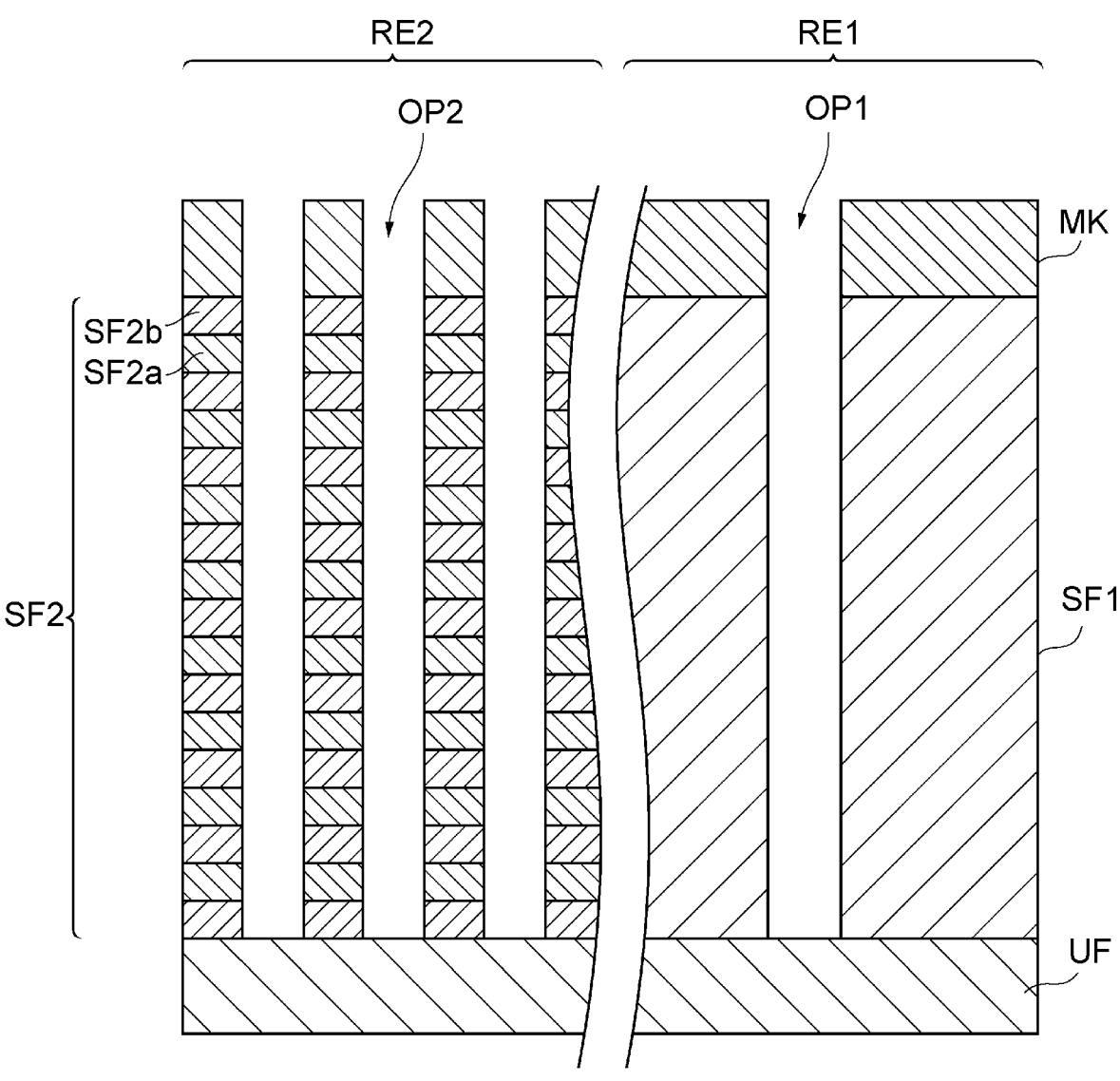
FIG. 6 is a view illustrating a cross-sectional structure of the substrate W after being processed in step ST4.

FIG. 6 is a view illustrating an example of a cross-sectional structure of the substrate W after being processed in step ST4. In the processed substrate W, the first silicon containing film SF1 and the second silicon containing film SF2 are etched in the depth direction, and the bottoms of the recess RC1 and the recess RC2 substantially simultaneously reach the underlying film UF. The aspect ratio of each of the recess RC1 and/or the recess RC2 in this state may be, for example, 20 or more, 30 or more, 40 or more, 50 or more, or 100 or more.

According to the present processing method, it is possible to improve the uniformity of the etching rates of both the first silicon containing film SF1 and the second silicon containing film SF2, while increasing the etching rates of the first silicon containing film SF1 and the second silicon containing film SF2. Therefore, the present processing method can suitably etch the first silicon containing film SF1 and the second silicon containing film SF2 even when, for example, the selection ratio with respect to the underlying film UF is not obtained and it is difficult to stop the etching with the underlying film UF.

EXAMPLES

Next, Examples of the present processing method will be described. The present disclosure is not limited to the following Examples.

Example 1

In Example 1, the present processing method was applied using the plasma processing apparatus 1, and a substrate having a structure similar to the substrate W illustrated in FIG. 4 was etched. As the mask MK, a polysilicon film was used. As the first silicon containing film SF1, a monolayer film (also referred to as an "Ox film") of a silicon oxide film was used. As the second silicon containing film SF2, a laminated film (also referred to as an "ON film") in which silicon nitride films SF2a and silicon oxide films SF2b are alternately and repeatedly laminated was used. The processing gas includes a HF gas, a phosphorus containing gas, and an argon gas. During etching, the temperature of the substrate support 11 was set to −70° C., and the supply (5 seconds) and the stop (10 seconds) of the supply of the source RF signal and the bias signal were repeated.

Reference Example 1

The substrate having the same configuration as that in Example 1 was etched using the plasma processing apparatus 1. The etching was performed under the same conditions as in Example 1, except that the supply of the source RF signal and the bias signal was continued during the etching. The etching rate of the Ox film in Example 1 was 1169 nm/min, and the etching rate of the ON film was 1196 nm/min. In Example 1, the selection rate of the ON film to the Ox film was 0.98. Further, the surface temperature of the substrate W was −31° C. In contrast, the etching rate of the Ox film in Reference Example 1 was 722 nm/min, and the etching rate of the ON film was 558 nm/min. In Reference Example 1, the selection ratio of the ON film to the Ox film was 0.77. Further, the surface temperature of the substrate W was 27° C.

In Example 1, the etching rates of both the first silicon containing film SF1 (Ox film) and the second silicon oxide film SF2 (ON film) were improved compared with Reference Example 1. This is considered to be because the adsorption of the HF species on the surfaces of the Ox film and the ON film was promoted by the decrease in temperature of the substrate W. Further, in Example 1, the selection ratio of the ON film to the Ox film, that is, the uniformity of the etching rates of the Ox film and the ON film, was also improved compared with Reference Example 1. This is considered to be because the Ox film has a larger adsorption promoting effect (that is, an increase amount in the etching rate) of the HF species due to the decrease in temperature compared with the ON film.

<Modification>

Various modifications may be made to the embodiment of the present disclosure without departing from the scope and gist of the present disclosure.

For example, in step ST4, the following processing may be performed instead of or in addition to repeating supplying the source RF signal and/or the bias signal and stopping the supply. That is, in step ST4, (A1) a step of supplying the source RF signal and the bias signal and (A2) a step of supplying the signal of at least one of the source RF signal and the bias signal at an effective value of the power lower than the signals in step (A1) may be alternately repeated. Even in this case, the surface temperature of the substrate W may be decreased, compared to the case where the source RF signal and the bias signal are consecutively supplied. Accordingly, the same effect as repeating supplying the source RF signal and/or the bias signal and stopping the supply can be obtained.

For example, in step ST4, the temperature of the substrate W or the substrate support 11 may be measured. Then, based on the measured temperature, the output of at least one of the source RF signal and the bias signal used in step ST4 may be adjusted. Here, the "output of the signal" may be, for example, one or more of the effective value of the power of the signal, the supply time of the signal, and the duty ratio of the signal. By adjusting the output of the signal, the temperature of the substrate W may be adjusted. For example, in a case where the measured temperature of the substrate W or the substrate support 11 is higher than the set value, the output of the signal may be lowered (the effective value of the power may be lowered, the supply time may be shortened, the duty ratio may be reduced, or the like) to lower the surface temperature of the substrate W.

For example, in step ST4, the following processing may be performed instead of or in addition to repeating supplying the source RF signal and/or the bias signal and stopping the supply. That is, the step of etching the first silicon containing film and the second silicon containing film by supplying the source RF signal and the bias signal, the step may include (B1) a step of measuring the temperature of the substrate W and/or the substrate support 11 and (B2) a step of controlling the temperature of the substrate W and/or the substrate support 11 to be equal to or lower than a given temperature, based on the measured temperature.

The temperature control of the substrate W and/or the substrate support 11 in step (B2) may be performed, for example, by adjusting the effective value of the power, the supply time, or the duty ratio of in the source RF signal. Further, the temperature control may be performed by adjusting an effective value of the power, a supply time, or a duty ratio in the bias RF signal. Further, the temperature control may be performed by adjusting the temperature or the flow rate of the electric heat fluid flowing through the flow path 1110a. Further, the temperature control may be performed by adjusting the temperature or the flow rate of the heat transfer gas supplied between the rear surface of the substrate W and the central region 111a. Further, the temperature control may be performed by adjusting an adsorption power between the electrostatic chuck 1111 and the substrate W. The temperature control may be performed by adjusting any one or more of the above-described conditions.

Further, for example, the present processing method may be executed using a plasma processing apparatus with any plasma source, such as inductively-coupled plasma or microwave plasma, in addition to the capacitively-coupled plasma processing apparatus 1.

Embodiments of the present disclosure further include the following aspects.

APPENDIX 1

An device manufacturing method executed in a plasma processing apparatus having a chamber, the method comprising:

(a) a step of providing a substrate having a first silicon containing film and a second silicon containing film including at least a silicon containing film of which type is different from the first silicon containing film, on a substrate support in a chamber;

(b) a step of supplying a processing gas including a HF gas and a phosphorus containing gas into the chamber; and (c) a step of simultaneously etching the first silicon containing film and the second silicon containing film by generating plasma from the processing gas in the chamber by a source RF signal and generating a bias potential on the substrate by a bias signal in a state where a temperature of the substrate support set to 0° C. or lower, wherein in the step (c), (c1) a step of supplying the source RF signal and the bias signal and (c2) a step of stopping supply of the source RF signal and the bias signal are alternately repeated.

APPENDIX 2

A program causes a computer of a plasma processing system including a chamber, a substrate support provided in the chamber, and a power source to execute:

(a) control of providing a substrate having a first silicon containing film and a second silicon containing film including at least a silicon containing film of which type is different from the first silicon containing film, on the substrate support, (b) control of supplying a processing gas including a HF gas and a phosphorus containing gas into the chamber, (c) control of simultaneously etching the first silicon containing film and the second silicon containing film by generating plasma from the processing gas in the chamber by a source RF signal, and generating a bias potential on the substrate by a bias signal in a state where a temperature of the substrate support set to 0° C. or lower, and in the control of the step (c), (c1) control of supplying the source RF signal and the bias signal from the power source and (c2) control of stopping supply of the source RF signal and the bias signal from the power source are alternately repeated.

APPENDIX 3

A recording medium storing the program according to Appendix 2.

APPENDIX 4

An etching method executed in a plasma processing apparatus having a chamber, the method comprising:

(a) a step of providing a substrate having a first silicon containing film and a second silicon containing film including at least a silicon containing film of which type is different from the first silicon containing film, on a substrate support in a chamber;

(b) a step of supplying a processing gas including a HF gas and a phosphorus containing gas into the chamber; and (c) a step of etching the first silicon containing film and the second silicon containing film by generating plasma from the processing gas in the chamber by a source RF signal and generating a bias potential on the substrate by a bias signal, wherein the step (c) includes (c1) a step of measuring a temperature of the substrate or the substrate support and (c2) a step of controlling the temperature of the substrate or the substrate support to be equal to or lower than a given temperature, based on the measured temperature.

REFERENCE SIGNS LIST

1: Plasma processing apparatus, 2: Controller, 10: Plasma processing chamber, 10s: Plasma processing space, 11: Substrate support, 13: Shower head, 20: Gas supply, 31a: First RF generator, 31b: Second RF generator, 32a: First DC generator, SF1: First silicon containing film, SF2: Second silicon containing film, MK: Mask, OP1, OP2: Opening, RC1, RC2: Recess, UF: Underlying film, W: Substrate

The invention claimed is:

1. An etching method executed in a plasma processing apparatus having a chamber, the etching method comprising:

a step (a) of providing a substrate on a substrate support in a chamber, wherein the substrate includes a first silicon containing film in a first region and a second silicon containing film in a second region, the first silicon containing film is a monolayer film, and the second silicon containing film is a laminated film in which two or more types of silicon films are laminated;

a step (b) of supplying a processing gas including a HF gas and a phosphorus containing gas into the chamber; and a step (c) of simultaneously etching the first silicon containing film and the second silicon containing film by generating plasma from the processing gas in the chamber by a source RF signal and generating a bias potential on the substrate by a bias signal, wherein the step (c) includes:

a step (c1) of supplying the source RF signal and the bias signal, and a step (c2) of stopping supply of at least one of the source RF signal and the bias signal or supplying at least one of the source RF signal and the bias signal, at an effective value of power lower than an effective value of power of the at least one of the source RF signal and the bias signal in the step (c1), and the step (c1) and (c2) are alternately repeated.

2. The etching method according to claim 1, wherein in the step (c), a temperature of the substrate support is set to 0° C. or lower.

3. The etching method according to claim 1, wherein the step (c) further includes a step of measuring a temperature of the substrate or a temperature of the substrate support.

4. The etching method according to claim 3, wherein in at least one of the step (c1) and the step (c2), any one or more of an effective value of power, a supply time, and a duty ratio in at least one of the source RF signal and the bias signal is adjusted based on the measured temperature.

5. The etching method according to claim 1, wherein the first silicon containing film includes a silicon oxide film.

6. The etching method according to claim 1, wherein the second silicon containing film includes a silicon oxide film and a silicon nitride film.

7. The etching method according to claim 1, wherein the substrate has a carbon containing mask on the first silicon containing film and the second silicon containing film.

8. The etching method according to claim 1, wherein in the step (c), a ratio of an etching rate of the second silicon containing film to an etching rate of the first silicon containing film is 0.95 to 1.05.

9. The etching method according to claim 1, wherein the source RF signal and the bias signal are pulsed waves.

10. The etching method according to claim 1, wherein the source RF signal and the bias signal are continuous waves.

11. The etching method according to claim 1, wherein a flow rate of the HF gas is a largest among the processing gases supplied in the step (b), excluding an inert gas.

12. The etching method according to claim 1, wherein the phosphorus containing gas is a halogenated phosphorus gas.

13. The etching method according to claim 1, wherein the processing gas further includes at least any one of a fluorocarbon gas and a hydrofluorocarbon gas.

14. The etching method according to claim 1, wherein the processing gas further includes a gas containing at least any one of tungsten, molybdenum, and titanium.

15. The etching method according to claim 1, wherein the processing gas further includes an oxygen containing gas.

16. The etching method according to claim 1, wherein the processing gas further includes a noble gas.

17. An etching method executed in a plasma processing apparatus having a chamber, the etching method comprising:

a step (a) of providing a substrate on a substrate support in a chamber, wherein the substrate includes a first silicon containing film in a first region and a second silicon containing film in a second region, the first silicon containing film is a monolayer film, and the second silicon containing film is a laminated film in which two or more types of silicon films are laminated;

a step (b) of supplying a processing gas into the chamber; and a step (c) of simultaneously etching the first silicon containing film and the second silicon containing film by generating plasma including a HF species and a phosphorus chemical species from the processing gas in the chamber by a source RF signal and generating a bias potential on the substrate by a bias signal, wherein the step (c) includes:

a step (c1) of supplying the source RF signal and the bias signal, and a step (c2) of stopping supply of at least one of the source RF signal and the bias signal or supplying at least one of the source RF signal and the bias signal, at an effective value of power lower than an effective value of power of the at least one of the source RF signal and the bias signal in the step (c1), and the step (c1) and (c2) are alternately repeated.

18. The etching method according to claim 17, wherein the HF species is generated from at least one gas of a HF gas or a hydrofluorocarbon gas.

19. The etching method according to claim 17, wherein the HF species is generated from a hydrofluorocarbon gas having 2 or more carbon atoms.

20. The etching method according to claim 17, wherein the HF species is generated from a fluorine containing gas and a hydrogen containing gas.

* * * * *